(12) United States Patent
Sugiyama et al.

(10) Patent No.: US 6,359,532 B1
(45) Date of Patent: Mar. 19, 2002

(54) ENERGY TRAPPING TYPE PIEZOELECTRIC FILTER WITH A SHIELDING CONDUCTIVE MEMBER ON A BOTTOM INSULATING BASE PLATE UPPER SURFACE

(75) Inventors: Takeshi Sugiyama, Ise; Manabu Wakita, Misono-mura, both of (JP)

(73) Assignee: NGK Spark Plug Co., Ltd. (JP)

( * ) Notice: Subject to any disclaimer, the term of this patent is extended or adjusted under 35 U.S.C. 154(b) by 0 days.

(21) Appl. No.: 09/655,830

(22) Filed: Sep. 6, 2000

(30) Foreign Application Priority Data

Sep. 6, 1999 (JP) ............................................ 11-251945

(51) Int. Cl.[7] .......................... H03H 9/205; H03H 9/10; H03H 9/58
(52) U.S. Cl. ..................... 333/189; 310/321; 310/345; 310/348; 310/366
(58) Field of Search ................................. 333/186–192, 333/133; 310/320, 321, 345, 348, 366

(56) References Cited

U.S. PATENT DOCUMENTS

| | | | |
|---|---|---|---|
| 5,939,956 A | * 8/1999 | Arimura et al. | ............ 333/189 |
| 6,002,308 A | 12/1999 | Gamo | |
| 6,011,451 A | 1/2000 | Gamo | |
| 6,160,462 A | * 12/2000 | Sugiyama et al. | .......... 333/189 |

FOREIGN PATENT DOCUMENTS

| | | |
|---|---|---|
| EP | 0 897 217 | 2/1999 |
| JP | 62-11314 | * 1/1987 |

OTHER PUBLICATIONS

Patent Abstracts of Japan, No. 07263999, Oct. 13, 1995; "Chip type piezoelectric filter and manufacture thereof"; NGK Spark Plug.

* cited by examiner

*Primary Examiner*—Justin P. Bettendorf
*Assistant Examiner*—Barbara Summons
(74) *Attorney, Agent, or Firm*—Larson & Taylor, PLC

(57) ABSTRACT

An energy trapping type piezoelectric filter comprising a first piezoelectric substrate (1A) and a second piezoelectric substrate (1B) having an identical configuration and arranged in layers with an adhesive sheet or spacer (20A) interposed therebetween and insulating top and base plates (30A, 30B) arranged on and under the respective piezoelectric substrates with adhesive sheets or spacers (20B, 20C) also interposed therebetween, wherein a shielding conductive member (40) is provided on an upper surface of the insulating base plate (30B) for preventing an electromagnetic coupling between an input electrode (31) and output electrodes (32A, 32B), the shielding conductive member (40) being connected to grounding electrodes (33A, 33B).

30 Claims, 7 Drawing Sheets

ENERGY TRAPPING TYPE PIEZOELECTRIC FILTER WITH A SHIELDING CONDUCTIVE MEMBER ON A BOTTOM INSULATING BASE PLATE UPPER SURFACE

BACKGROUND OF THE INVENTION

1. Field of the Invention

The present invention relates to an energy trapping type piezoelectric filter comprising a substrate having a plurality of oscillating sections.

2. Prior Art

Various energy trapping type piezoelectric filters have been proposed. For example, Japanese Patent Application Laid-Open No. 7-263999 discloses one of such piezoelectric filters. The disclosed filter comprises a pair of oscillating sections laterally arranged and a capacitor electrode centrally arranged on a surface of a single piezoelectric substrate. Such a conventional arrangement, however, has disadvantages that the piezoelectric substrate inevitably is forced to have an oblong profile and the piezoelectric filter has to have a large surface area for carrying the components thereon. Additionally, such a piezoelectric filter is subjected to various restrictions in terms of the profile, the thickness and the regions assigned to the oscillating sections to significantly limit the variable capacitance range, although the piezoelectric filter has only a single coupling capacitor.

In order to overcome such disadvantage there has been proposed another energy trapping type piezoelectric filter comprising two piezoelectric substrates one of which is provided with one of the two oscillating sections and the other is provided with the other oscillating section. That is, such a piezoelectric filter comprises a first and second piezoelectric substrates adapted to produce a single oscillating section, a pair of input/output connection terminals and a grounding terminal when laid one on the other, and a pair of insulating cover plates having a pair of input/output electrodes and a grounding electrode (see, for example, EP 0897217A2). This filter arrangement comprises the first and second piezoelectric substrates are stacked to each other. There are, therefore, advantages that the overall size of the filter can be reduced substantially to half that of the conventional arrangement disclosed in Japanese Patent Application Laid-Open No. 7-263999, the area of the respective piezoelectric substrate can be reduced, and a mounting area of the filter can be reduced. Furthermore, the first and second piezoelectric substrates are provided with respective coupling electrodes that are connected in parallel. This results in other advantages that a coupling capacitance thereof can be suitably set, and a circuit design can be easily made compared with the conventional arrangement having a single coupling capacitor. An equivalent circuit of the piezoelectric filter of this kind is illustrated in FIG. 8 of the accompanying drawings.

Thus, the first and second piezoelectric substrates, each having a single oscillating section, are laid one on the other in an energy trapping type piezoelectric filter having the above described configuration so that they have only a limited surface area for carrying the related components of the piezoelectric filter. Additionally, the first and second piezoelectric substrates carry thereon respective capacitor electrodes that are connected to each other. Therefore, the coupling capacitance of the device can be selected freely to allow an enhanced degree of freedom for the design of the device if compared with conventional piezoelectric filters of the type under consideration having a single coupling capacitor.

With such an arrangement the first piezoelectric substrate will be laid on the second piezoelectric substrate or vice versa. The distance between the input/output connection terminals of the first and second piezoelectric substrates will be reduced significantly if compared with the conventional device as described in the above. Also, the distance between the input electrode and the output electrode disposed on one of the insulating cover plates of a piezoelectric filter will be reduced. Therefore, it will be apt to easily become electromagnetically coupled with each other to damage the attenuation characteristic of the device.

In the previously proposed energy trapping type piezoelectric filter having a single oscillating section provided on a piezoelectric substrate, when an attempt is made for more reducing the total area of the filter, an output electrode and an input electrode provided on an insulating base plate become closer to each other. Therefore, a mutual electromagnetic coupling may be easily induced. This results in a deterioration of an attenuation characteristic of the filter. In order to avoid any deterioration of the attenuation characteristic of the filter it has been proposed that shielding electrode section is formed on the bottom surface of the insulating base substrate at a region between the output electrode and the input electrode, thereby improving the attenuation characteristic. However, it has been found that an influence of a coupling of the output electrode and the input electrode outside of the bottom surface of the insulating base substrate is not negligible. This is certainly due to the fact that the base plate or substrate has a very thin configuration or a thickness of about 0.5 mm in comparison with a thickness of the piezoelectric filter that is typically about 1.5 mm.

It is, therefore, an object of the invention to provide an energy trapping type piezoelectric filter in which a coupling of an input and output electrodes is more reduced to improve an attenuation characteristic of the filter.

SUMMARY OF THE INVENTION

According to a first aspect of the invention, there is provided an energy trapping type piezoelectric filter comprising:

a first piezoelectric substrate having an oscillating section, an output connecting terminal and grounding connector terminals;

a second piezoelectric substrate having an oscillating section, an input connecting terminal and grounding connector terminals;

the first and second piezoelectric substrates being stacked to each other so that the output connector terminal on the first piezoelectric substrate is positioned with respect to the input connector terminal on the second piezoelectric substrate with a certain discrepancy between them in a perpendicular direction;

an insulating base plate having a bottom surface provided with an input electrode which is connected to the input connecting terminal, two output electrodes which are connected to the output connecting terminal, and ground electrodes which are connected to the grounding connector terminals, the insulating base plate being arranged as a most bottom layer; and a shielding conductive member provided on an upper surface of the insulating base plate for preventing an electromagnetic coupling between the input electrode and the output electrodes, the shielding conductive member being connected to the ground electrodes.

With the provision of the shielding conductive member on an upper surface of the insulating base plate between the input/output electrodes, any coupling of the input/output electrodes can be effectively prevented, thereby improving an attenuation characteristic of the filter.

According to a second aspect of the invention there is provided an energy trapping type piezoelectric filter comprising:

first piezoelectric substrate having a first main surface and a second main surface opposite to the first main surface, the first main surface including a first pair of oscillating electrodes arranged vis-a-vis relative to each other and a first capacitor electrode, one of the oscillating electrodes being electrically connected to the first capacitor electrode, and the other oscillating electrode being electrically connected to an output connection terminal which is arranged on a lateral edge portion of the first piezoelectric substrate to form a first electrode pattern on the first surface, the second main surface including a common electrode arranged oppositely relative to the first pair of oscillating electrodes and a second capacitor electrode arranged opposite to the first capacitor electrode, the second capacitor electrode and the common electrode being electrically connected to each other to form a second electrode pattern on the second surface, the pair of oscillating electrodes and the common electrode defining a first oscillating section, and the first and second capacitor electrodes defining a first coupling capacitor;

a second piezoelectric substrate having a first main surface and a second main surface opposite to the first main surface, the first main surface including a second pair of oscillating electrodes arranged vis-a-vis relative to each other and a third capacitor electrode, one of the oscillating electrodes being electrically connected to the third capacitor electrode, and the other oscillating electrode being electrically connected to an input connection terminal which is arranged on a lateral edge portion of the second piezoelectric substrate to form a third electrode pattern on the first surface, the second main surface including a common electrode arranged oppositely relative to the second pair of oscillating electrodes and a fourth capacitor electrode arranged opposite to the third capacitor electrode, the fourth capacitor electrode and the common electrode being electrically connected to each other to form a fourth electrode pattern on the second surface, the pair of oscillating electrodes and the common electrode defining a second oscillating section, and the third and fourth capacitor electrodes defining a second coupling capacitor;

the first and second piezoelectric substrates being laid one on the other to form a multilayer structure without obstructing the oscillation of the oscillating sections and making the output connecting terminal on the first piezoelectric substrate and the input connecting terminal on the second piezoelectric substrate vertically aligned relative to each other, the first capacitor electrode on the first piezoelectric substrate being connected to the third capacitor electrode on the second piezoelectric substrate, and the second capacitor electrode on the first piezoelectric substrate being connected to the fourth capacitor electrode on the second piezoelectric substrate;

an insulating base plate having a bottom surface provided with an output electrode which is vertically aligned with and connected to the output connecting terminal, an input electrode which is vertically aligned with and connected to the input connecting terminal, and a ground electrode which is connected to each of the second and fourth electrode patterns, the insulating base plate being arranged as a most bottom layer; and a shielding conductive member provided on an upper surface of the insulating base plate for preventing an electromagnetic coupling between the input/output electrodes, the shielding conductive member being connected to the ground electrode.

In the arrangement of the present invention, the shielding conductive member may be arranged to surround an input connector terminal provided on the upper surface of the insulating base plate and connected to the input electrode.

The input electrode and the two output electrodes may preferably be arranged at corners of the insulating base plate, and the grounding electrodes may be arranged at middle of opposite lateral edges of the insulating base plate.

One end of the shielding conductive member may be connected via a grounding connector terminal to one of the ground electrodes, and the other end may be connected via another grounding connector terminal to one end of a shielding electrode which is provided on bottom surface of the insulating base plate.

The insulating base plate may include a conductive connector member provided on the upper surface thereof for connecting the two output electrodes.

It is preferable that the input electrode and one of the out two output electrodes which is connected to an external output circuit may be arranged at both ends of one lateral edge of the insulating base plate

DESCRIPTION OF THE PREFERRED
EMBODIMENTS OF THE INVENTION

The present invention will now be described with reference to the accompanying drawings that illustrate preferred embodiments of the invention.

Figure 1:
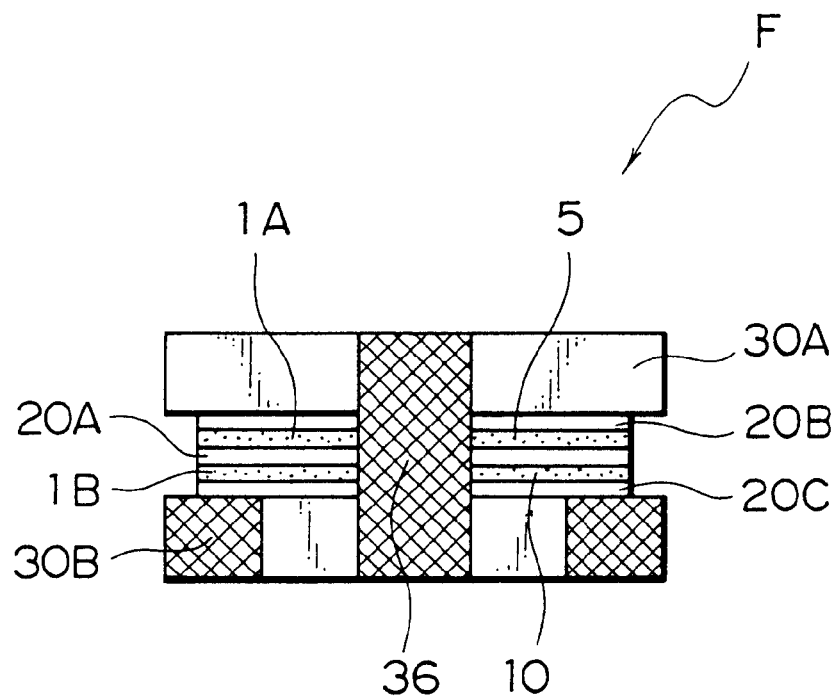
FIG. 1 is a schematic front view of an energy trapping type piezoelectric filter F according to the present invention.
Figure 2:
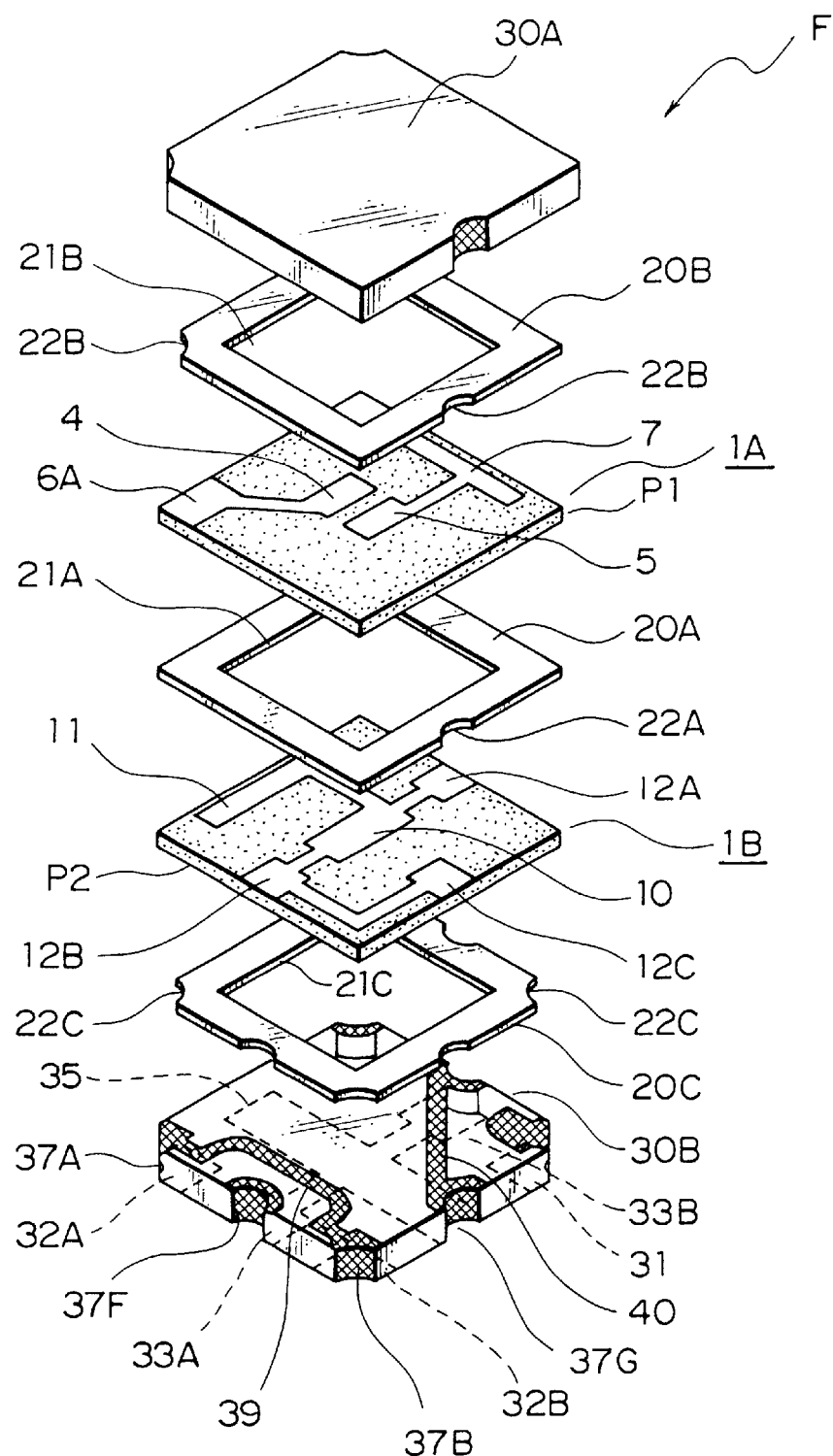
FIG. 2 is an exploded schematic perspective view of the piezoelectric filter F shown in FIG. 1.

Referring to FIGS. 1 and 2, there is illustrated an arrangement of first embodiment of energy trapping type piezoelectric filter F according to one embodiment of the present invention.

The piezoelectric filter F comprises a first piezoelectric substrate 1A and a second piezoelectric substrate 1B having an identical configuration and arranged in layers with an adhesive sheet or spacer 20A interposed therebetween and insulating top and bottom plates 30A, 30B arranged on and under the respective piezoelectric substrates with adhesive sheets or spacers 20B, 20C also interposed therebetween.

Figure 3A:
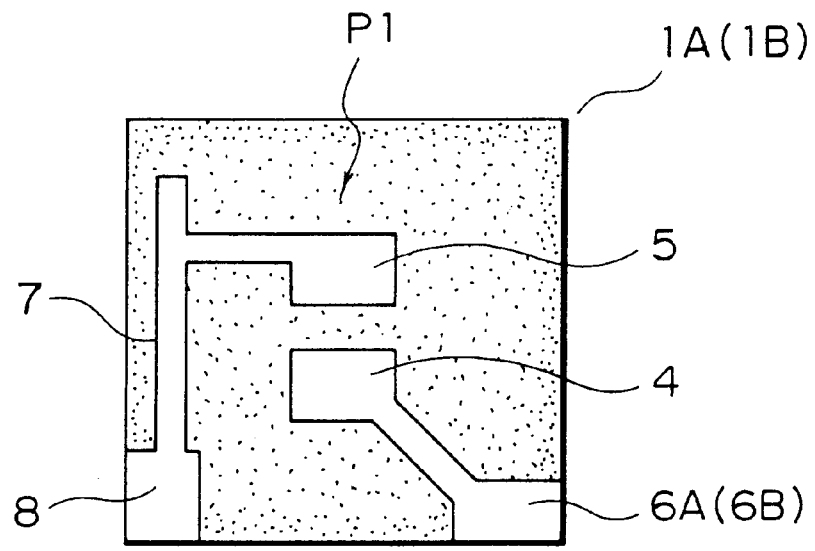
FIG. 3A is a schematic plan view of the upper surface of the piezoelectric substrates in the embodiment of FIG. 1.

Now, the piezoelectric substrates 1A, 1B will be described in detail by referring to FIG. 3.

The piezoelectric substrates 1A, 1B are made of a piezoelectric ceramic material such as $PbTiO_3$, $PbZrO_3$ or $PbTiO_3$—$PbZrO_3$ and each of them carries electrode patterns P1, P2 arranged respectively on the opposite surfaces thereof. The electrode patterns P1, P2 arranged on the opposite surfaces of each of the piezoelectric substrates 1A, 1B may be typically formed by evaporation of silver or by screen printing.

Firstly, the electrode pattern P1 arranged on the first surface of each of the piezoelectric substrates 1A, 1B will be described.

A pair of oscillatory electrodes 4 and 5 are arranged on the first surface and separated from each other. The oscillatory electrode 4 obliquely extends to a corner of the piezoelectric substrate 1A or 1B to form an output connection terminal 6A or an input connection terminal 6B (along edges starting from the corner). In other words, the output and input connection terminals 6A, 6B are formed on the piezoelectric substrates 1A, 1B at a biased position along the lateral edges thereof. Since the first piezoelectric substrate 1A and the second piezoelectric substrate 1B have an identical configuration, the output and input connection terminals 6A, 6B are to be positioned to separate the respective functions by turning the piezoelectric substrates 1A, 1B by 90° to each other and stacking them. Therefore, the output and input connection terminals 6A, 6B are located askance relative to each other and hence do not interfere with each other.

On the first surface of each of the piezoelectric substrates, a first narrow strip-shaped capacitor electrode 7 is arranged along the lateral edge opposite to the edge where the input or output connection terminal 6B or 6A is formed. The capacitor electrode 7 is connected to the oscillatory electrode 5 and has one end which extends to another corner of the piezoelectric substrate to form a connector terminal 8.

Now, the electrode pattern P2 on the second surface of each of the piezoelectric substrates will be described.

Figure 3B:
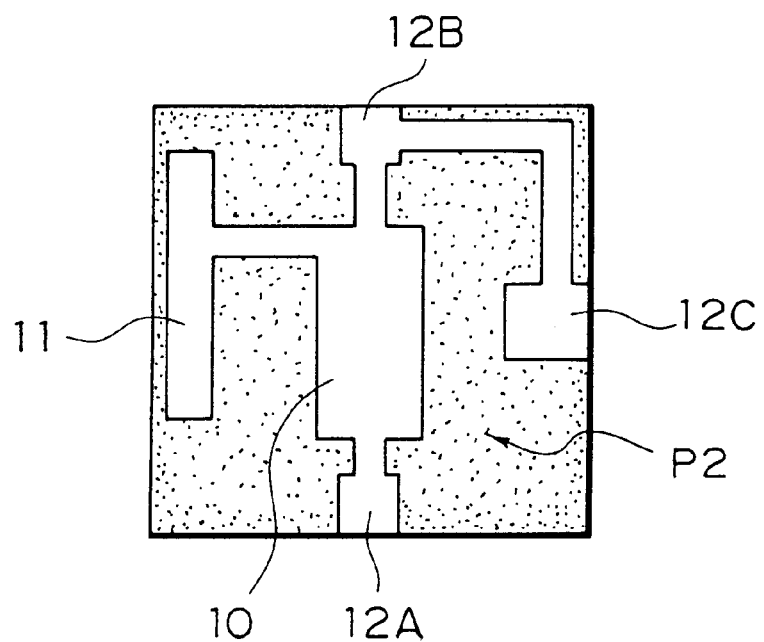
FIG. 3B is a schematic plan view of the lower surface of the piezoelectric substrates in the embodiment of FIG. 1.

As will be seen in FIG. 3B, the electrode pattern P2 comprises a common electrode 10 arranged oppositely relative to said pair of oscillatory electrodes 4, and a second capacitor electrode 11 disposed oppositely relative to the first capacitor electrode 7 on the first surface and electrically connected to the common electrode 10. The common electrode 10 extends laterally to the opposite lateral edges to form first and second grounding connector terminals 12A, 12B. One of the grounding connector terminals 12B has a L shaped extension which is provided with third grounding connector terminal 12C. The grounding connector terminal 12C is arranged on an intermediate position along one lateral edge of the respective piezoelectric substrate.

Figure 8:
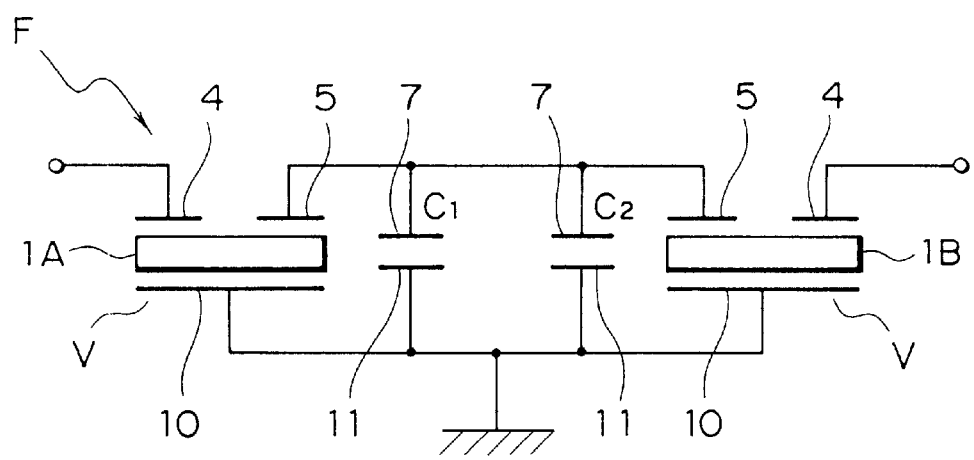
FIG. 8 is an equivalent circuit of the piezoelectric filter F.

Thus, as will be seen in FIG. 8, the pair of oscillatory electrodes 4, 5 and the common electrode 10 of each of the piezoelectric substrates 1A, 1B form an oscillating section V. The first and second capacitor electrodes 7, 11 of the piezoelectric substrates 1A, 1B form respective coupling capacitors $C_1$, $C_2$.

Then, the first piezoelectric substrate 1A and the second piezoelectric substrate 1B are turned upside down and by 90°, and are laid one on the other with an adhesive sheet or spacer 20A being interposed therebetween. Subsequently, a pair of adhesive sheets or spacers 20B, 20C are arranged respectively on and under the first and second piezoelectric substrates 1A, 1B. Each of the adhesive sheets 20A, 20B, 20C is provided with a rectangular opening 21A, 21B, 21C at the center so as not to obstruct the oscillation of the related oscillating section or oscillating sections V.

An insulating top plate 30A is disposed on the upper surface of the adhesive sheet 20B, while an insulating bottom plate 30B is disposed under the lower surface of the adhesive sheet 20C. Consequently, there is obtained an integrally assembled or stacked structure in which the respective components are connected to each other by the respective adhesive sheets 20A, 20B, 20C.

Figure 4A:
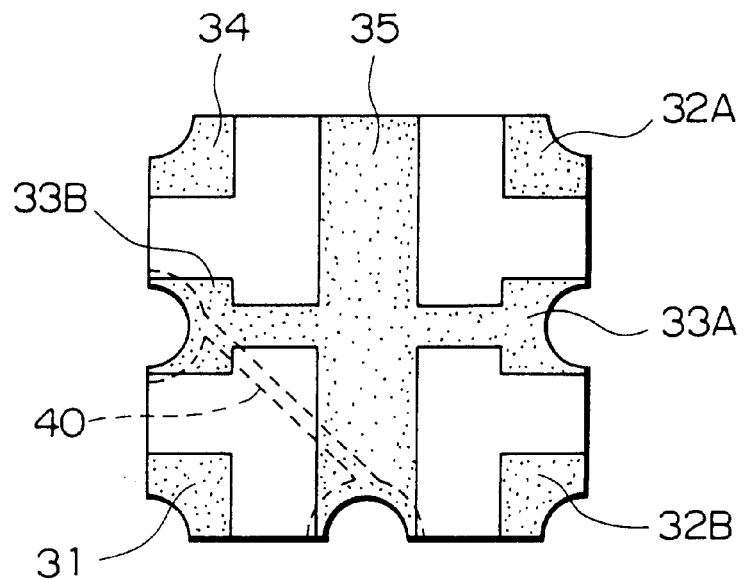
FIG. 4A is a schematic plan view of the upper surface of the insulating bottom plate in the embodiment of FIG. 1.

Then, as shown in FIGS. 2 and 4A, on the lower surface of the insulating bottom plate 30B are provided an input electrode 31, output electrodes 32A, 32B, grounding electrodes 33A, 33B and a connector electrode 34. The input electrode 33, the output electrodes 32A, 32B and the connector electrode 34 are respectively positioned at the respective corner areas of the insulating bottom plate 30B. Each of the grounding electrodes 33A, 33B is positioned at an intermediate portion of the associated lateral edge of the insulating bottom plate 30B. A shielding electrode 35 is provided between the input electrode 31 and the output electrodes 32A, 32B so that it extends through the center portion to the opposite edges of the insulating bottom plate 30B. The shielding electrode 35 has a lateral extension which has both ends connected to the grounding electrodes 33A, 33B. Therefore, the shielding electrode 35 has a Greek cross configuration and is intended to produce electromagnetic shielding among the input electrode 31, the output electrodes 32A, 32B and the connector electrode 34 provided at the respective corners. By the shielding electrode 35 connected to the grounding electrodes 33A, 33B the input electrode 31 and the output electrodes 32A, 32B are prevented from being electromagnetically coupled.

In the stacked structure, the connector terminal 8 of the first capacitor electrode 7 on the first surface of the first piezoelectric substrates 1A is connected to the connector terminal 8 of the first capacitor electrode 7 on the first surface of the second piezoelectric substrate 1B. The grounding connection terminals 12B, 12C on the electrode pattern P2 are connected to each other. The output connector terminal 6A on the first piezoelectric substrate 1A is connected to the output electrodes 32A, 32B on the bottom plate 30B. The input connector terminal 6B on the second piezoelectric substrate 1B is connected to the input electrode 31 on the bottom plate 30B. The electrode pattern P2 is connected to the grounding electrodes 33A, 33B on the bottom plate 30B.

Now, the conductor means for connecting the electrodes will be described below.

The adhesive sheets 20A, 20B, 20C are provided respectively with recesses 22A, 22B, 22C at relevant edges thereof. After the components are assembled to form a multilayer structure, the electrodes are electrically connected by filling the recesses 22A, 22B, 22C with an electrically conductive material 36. In other words, the electrically conductive material 36 filled in the recesses 22A, 22B, 22C forms conduction paths for connecting the electrodes.

Figure 4B:
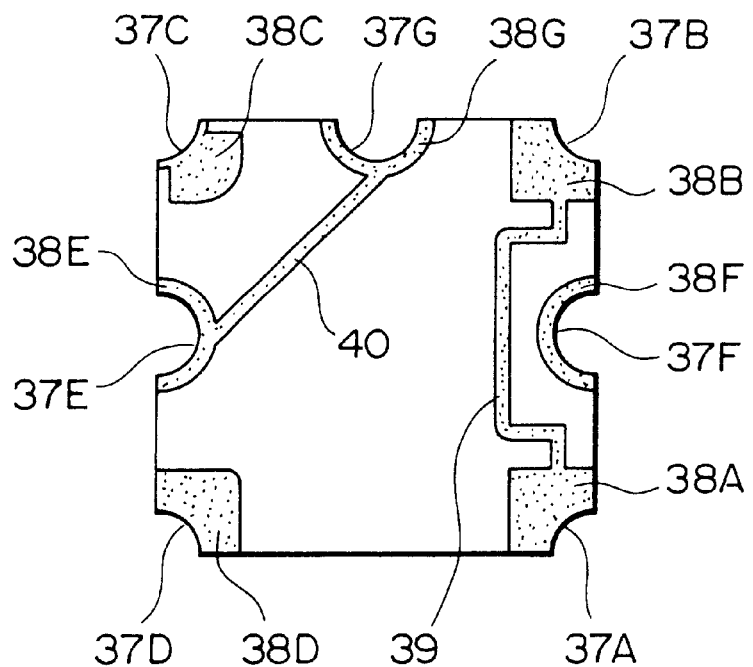
FIG. 4B is a schematic plan view of the lower surface of the insulating bottom plate in the embodiment of FIG. 1.

As will be seen in FIG. 4B, the insulating bottom plate 30B are provided with conducting recesses 37A, 37B, 37C, 37D at four corners thereof. These conducting recesses 37A, 37B, 37C, 37D are connected to the respective output electrodes 32A, 32B, the input electrode 31 and the connector electrode 34, respectively. At the intermediate portions along the opposite lateral edges of the insulating bottom plate 30B are provided conducting recesses 37E, 37F which are connected to the grounding electrodes 33B, 33A, respectively. A conducting recess 37G is provided at an intermediate portion along one of another opposite lateral edges of the insulating bottom plate 30B. This conducting recess 37G is connected to one end of the shielding electrode 35. After the components are assembled to form a multilayer structure, each of the conducting recesses 37A–37G is filled with an electrically conductive material.

The respective conducting recesses 37A–37G are connected to output connection electrodes 38A, 38B, an input connection electrode 38C, a connector electrode 38D and grounding connection electrodes 38E, 38F, 38G which are formed on the insulating bottom plate 30B, respectively.

As described above, one of the piezoelectric substrates 1A, 1B is longitudinally turned upside down and displaced by 90° to the other one so that the electrode patterns P1 and P2 appear asymmetric if viewed from above and the connector terminals 8, 8 of the capacitor electrodes 7, 7 and the connector terminals 12B, 12C of the capacitor electrodes 11, 11 are vertically aligned respectively.

The connector terminals 8, 8 of the capacitor electrode 7, 7 on the first and second piezoelectric substrates 1A, 1B are connected through the recesses or conduction paths 22A, 22C of the adhesive sheets 20A, 20C and the conductive recess 37D of the bottom sheet 30B to the connector electrode 34 on the bottom sheet 30B. Similarly, the connector terminals 12B, 12C of the capacitor electrodes 11, 11 on the first and second piezoelectric substrates 1A, 1B are connected through the conduction paths 22A, 22C of the adhesive sheets 20A, 20C and the conductive recesses 37F, 37G to the grounding electrode 33A and the shielding electrode 35 on the bottom sheet 30B.

The output connector terminal 6A on the first piezoelectric substrate 1A is connected via the conduction path 22C formed at left side corner of the adhesive sheet 20C to the output electrode 32A. The input connector terminal 6B is connected via the conduction path in the recess 22C formed at right side corner of the adhesive sheet 20C to the input electrode 31.

The piezoelectric filter F of this embodiment having the above described configuration shows a substantially square profile whose upper and lower surfaces have an area that is about a half of the surface area of any known piezoelectric filter of the type under consideration. Additionally, the insulating top and bottom plates 30A, 30B protect the electrode patterns P1, P2 both mechanically and electrically. The electrically conductive material 36 and the electrodes 31, 32A, 32B, 33A, 33B, 34, 35 are exposed only on the peripheral surfaces and the lower surface to make the piezoelectric filter F1 easy to handle.

FIG. 8 shows a circuit diagram of an equivalent circuit of the piezoelectric filter F when the conductors are arranged on it. Unlike the conventional circuit arrangement, this circuit comprises a pair of coupling capacitors $C_1$, $C_2$ connected in parallel, the total coupling capacitance of the circuit being the sum of the capacitances of the two capacitors. Thus, a desired and sufficient coupling capacitance can be secured for the circuit that has the above described circuit configuration. It will be appreciated that such a circuit can be designed without difficulty.

The illustrated piezoelectric filter F has a very small square profile in a plane whose dimension may have a side length of 3.1 mm and a thickness of 1, 5 mm.

Furthermore, on the upper surface of the shielding bottom plate 30B is formed a conductive path 39 for connecting the output electrodes 32A, 32B to each other. That is, the output electrode 32A is connected to the output electrode 32B by the conductive path 39, and thus is connected to the output connector terminal 6A on the corresponding piezoelectric substrate. The output electrode 32B is connected to an external output circuit not shown. The input electrode 31 is connected to an external input circuit not shown. Consequently, the output electrode 32B and input electrode 31 may be arranged in juxtaposition, and thus an output circuit and an input circuit can be formed on a printed circuit board for mounting the filter so that they become adjacent to each other. This results in that a circuit pattern can be well arranged on the printed circuit board.

A shielding conductive path 40 is also formed on the upper surface of the shielding bottom plate 30B. This shielding conductive path 40 is bridged between the grounding connector electrodes 38E, 38G provided respectively on the intermediate sections of the two side edges containing the corner where the input electrode 31 is arranged. The shielding conductive path 40 is electrically connected to the grounding electrode 33B.

With the provision of the shielding conductive path 40 intended to surround the input electrode 31, the input electrode 31 is electromagnetically separated from the output connector electrodes 32A, 32B, thereby avoiding any magnetic coupling therebetween. In particular, such magnetic couplings may easily occur on the upper surface of the bottom plate 30B because the upper surface of the bottom plate 30B contains the output connector electrodes 38A, 38B, the conductive path 39 for short circuiting these output connector electrodes and the input connector electrode 38C. However, such magnetic couplings can effectively be avoided by means of the provision of the shielding conductive path 40.

Further, since the output connector terminal 6A and input connector terminal 6B are disposed above the bottom plate 30B and the piezoelectric substrates 1A, 1B are very thin, for example about 0.1 mm, an electromagnetic coupling between the output connector terminal 6A and input connector terminal 6B becomes serious. However, this serious electromagnetic coupling can be also overcome by the provision of the shielding conductive path 40.

Figure 5:
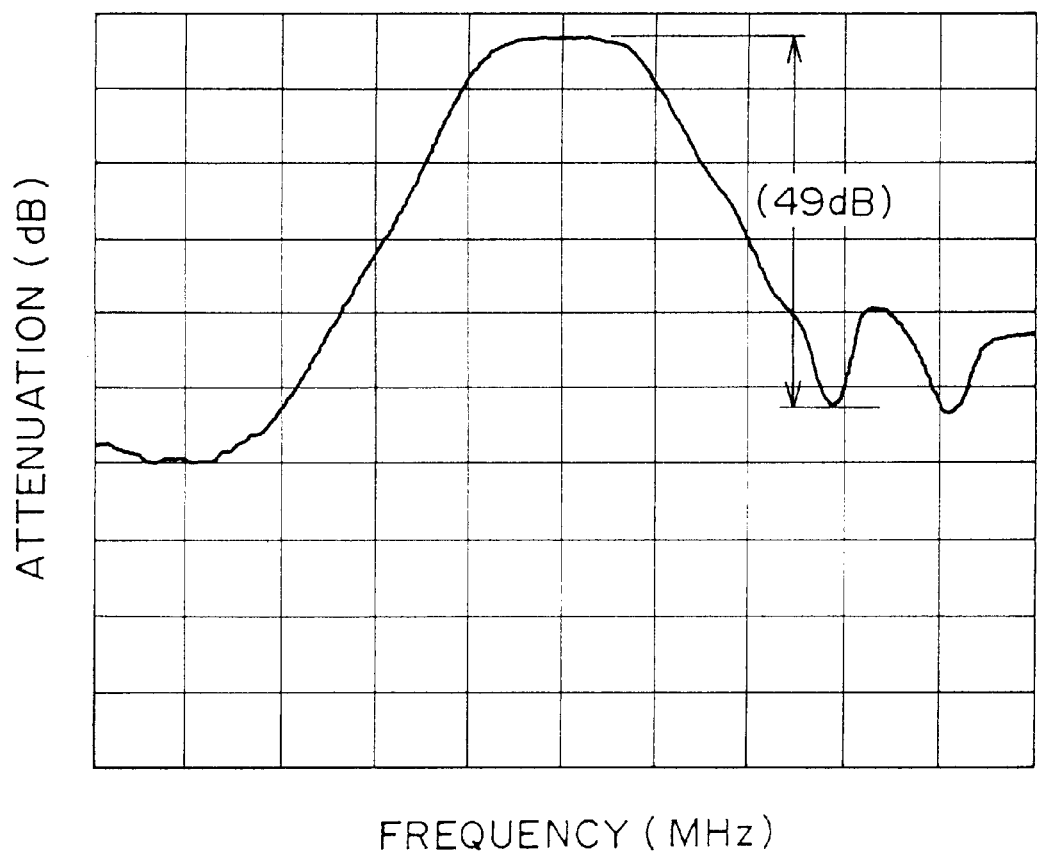
FIG. 5 is a graph showing the attenuation characteristic of the arrangement according to the embodiment of the invention.
Figure 6:
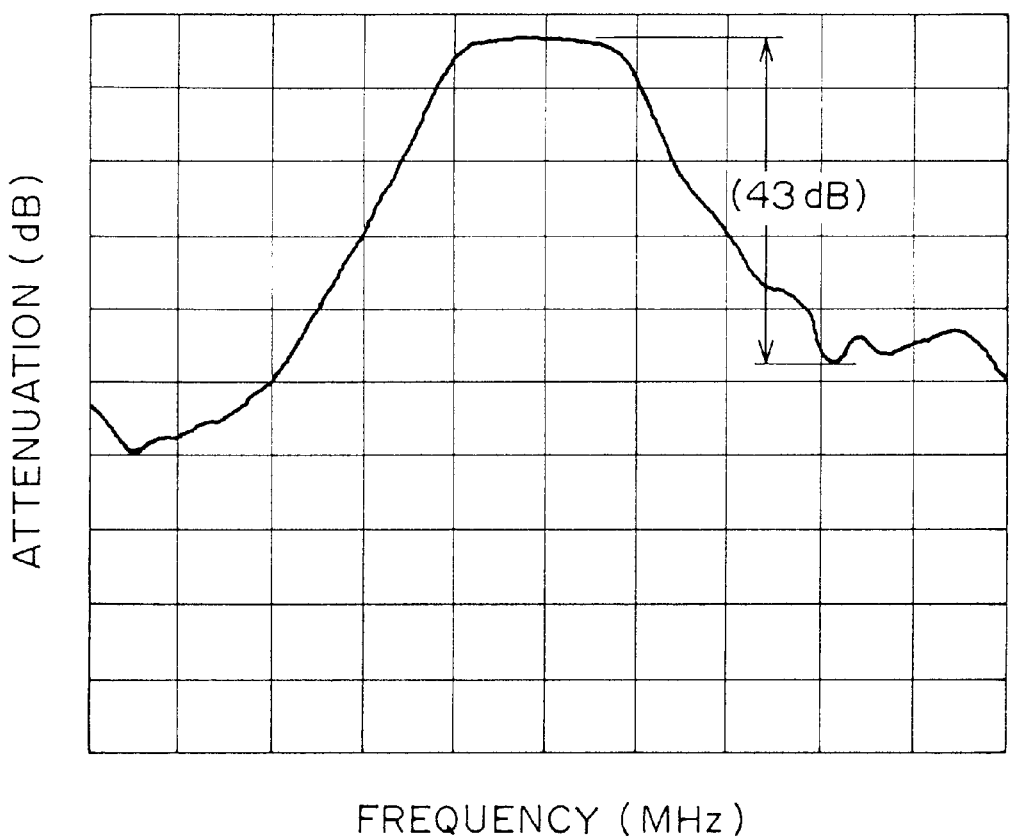
FIG. 6 is a graph showing the attenuation characteristic of the arrangement previously proposed.
Figure 7:
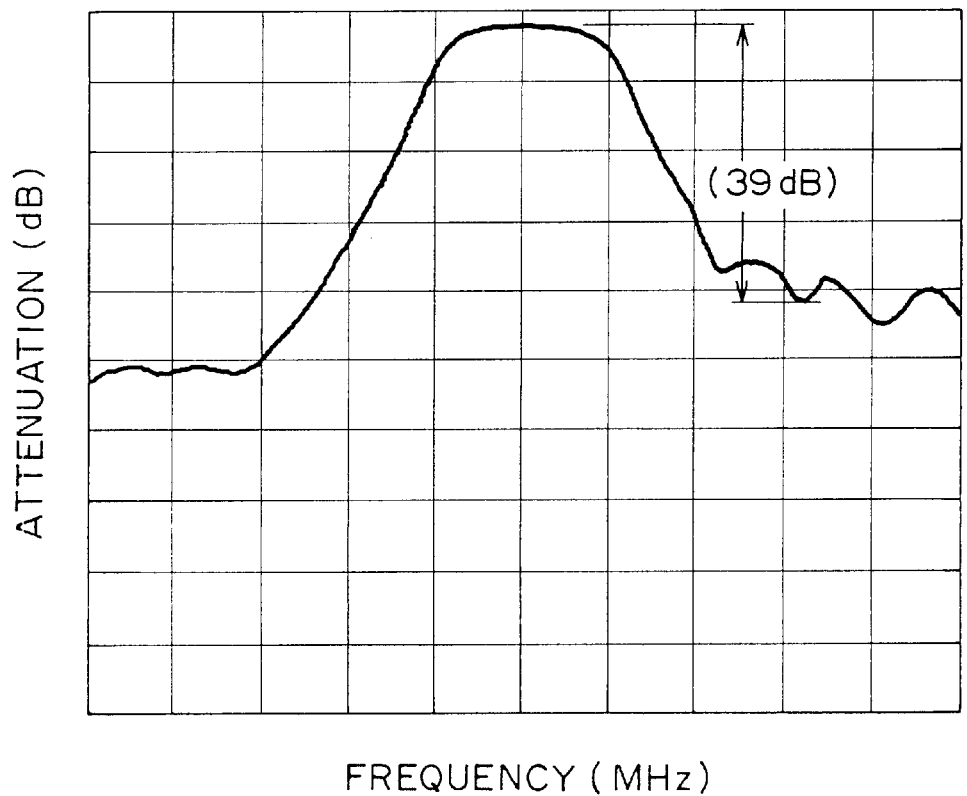
FIG. 7 is a graph showing the attenuation characteristic of the conventional arrangement.

FIG. 5 shows an attenuation characteristic of the arrangement according to the present invention including the shielding electrode 35 and the shielding conductive path 40. FIG. 6 shows an attenuation characteristic of the arrangement including only the shielding electrode 35. FIG. 7 shows an attenuation effect of the conventional arrangement having neither such shield electrode nor shielding conductive path.

It will be appreciated that the attenuation of the arrangement according to the present invention is 49dB as shown in FIG. 5. The attenuation of the arrangement in which only the shielding electrode 35 is provided is 43dB as shown in FIG. 6, and the attenuation effect of the conventional arrangement is 39dB as shown in FIG. 7. This means that an attenuation of an energy trapping type piezoelectric filter can be more improved by the arrangement according to the present invention.

As described above, an energy trapping type piezoelectric filter F according to the present invention comprises a pair of piezoelectric substrates that include thereon electrode patterns P1, P2 and are laid one on the other wherein a shielding bottom plate 30B is provided as a bottom layer. The shielding bottom plate 30B is provided with an input electrode 31, output electrodes 32A, 32B, and a shielding conductive path 40 arranged between the input electrode 31 and the output electrodes 32A, 32B for preventing any electromagnetic coupling therebetween. The shielding conductive path 40 is grounded.

With this arrangement, any tendency of electromagnetically coupling the input electrode 31 and the output electrodes 32A, 32B and the two input/output connection terminals 6A, 6B are obstructed to improve the attenuation characteristic of the piezoelectric filter. Thus, there can be provided an energy trapping type piezoelectric filter having a desired characteristic without extending the area of each of the piezoelectric substrate. Also, it is possible to retain a reduction of the surface area to be obtained by laying a pair of piezoelectric substrates 1A, 1B one on the other without sacrificing the performance of the device.

What is claimed is:

1. An energy trapping type piezoelectric filter comprising:

a first piezoelectric substrate having an oscillating section, an output connecting terminal and grounding connector terminals;

a second piezoelectric substrate having an oscillating section, an input connecting terminal and grounding connector terminals;

the first and second piezoelectric substrates being stacked to each other so that the output connector terminal on the first piezoelectric substrate is positioned with respect to the input connector terminal on the second piezoelectric substrate with a certain discrepancy between them in a perpendicular direction;

an insulating base plate having a bottom surface provided with an input electrode which is connected to the input connecting terminal, two output electrodes which are connected to the output connecting terminal, and ground electrodes which are connected to the grounding connector terminals, the insulating base plate being arranged as a most bottom layer; and a shielding conductive member provided on an upper surface of the insulating base plate for preventing an electromagnetic coupling between the input electrode and the output electrodes, the shielding conductive member being connected to the ground electrodes.

2. An energy trapping type piezoelectric filter as claimed in claim 1, wherein said shielding conductive member is arranged to surround an input connector terminal provided on the upper surface of said insulating base plate (30B) and connected to said input electrode.

3. An energy trapping type piezoelectric filter as claimed in claim 2, wherein said input electrode and said two output electrodes are arranged at corners of said insulating base plate, and said ground electrodes are arranged at middle of opposite lateral edges of said insulating base plate.

4. An energy trapping type piezoelectric filter as claimed in claim 2, wherein said shielding conductive member has one end connected via a grounding connector terminal to one of said ground electrodes and the other end connected via another grounding connector terminal to one end of a shielding electrode which is provided on a bottom surface of said insulating base plate.

5. An energy trapping type piezoelectric filter as claimed in claim 2, wherein said insulating base plate includes a conductive connector member provided on the upper surface thereof for connecting said two output electrodes.

6. An energy trapping type piezoelectric filter as claimed in claim 2, wherein said input electrode and one of said two output electrodes which is connected to an external output circuit are arranged at both ends of one lateral edge of said insulating base plate.

7. An energy trapping type piezoelectric filter as claimed in claim 1, wherein said input electrode and said two output electrodes are arranged at corners of said insulating base plate, and said ground electrodes are arranged at middle of opposite lateral edges of said insulating base plate.

8. An energy trapping type piezoelectric filter as claimed in claim 7, wherein said shielding conductive member has one end connected via a grounding connector terminal to one of said ground electrodes and the other end connected via another grounding connector terminal to one end of a shielding electrode which is provided on a bottom surface of said insulating base plate.

9. An energy trapping type piezoelectric filter as claimed in claim 7, wherein said insulating base plate includes a conductive connector member provided on the upper surface thereof for connecting said two output electrodes.

10. An energy trapping type piezoelectric filter as claimed in claim 7, wherein said input electrode and one of said two output electrodes which is connected to an external output circuit are arranged at both ends of one lateral edge of said insulating base plate.

11. An energy trapping type piezoelectric filter as claimed in claim 1, wherein said shielding conductive member has one end connected via a grounding connector terminal to one of said ground electrodes and the other end connected via another grounding connector terminal to one end of a shielding electrode which is provided on bottom surface of said insulating base plate.

12. An energy trapping type piezoelectric filter as claimed in claim 11, wherein said insulating base plate includes a conductive connector member provided on the upper surface thereof for connecting said two output electrodes.

13. An energy trapping type piezoelectric filter as claimed in claim 11, wherein said input electrode and one of said two output electrodes which is connected to an external output circuit are arranged at both ends of one lateral edge of said insulating base plate.

14. An energy trapping type piezoelectric filter as claimed in claim 1, wherein said insulating base plate includes a conductive connector member provided on the upper surface thereof for connecting said two output electrodes.

15. An energy trapping type piezoelectric filter as claimed in claim 14, wherein said input electrode and one of said two output electrodes which is connected to an external output circuit are arranged at both ends of one lateral edge of said insulating base plate.

16. An energy trapping type piezoelectric filter comprising:

a first piezoelectric substrate having a first main surface and a second main surface opposite to the first main surface, the first main surface including a first pair of oscillating electrodes arranged vis-a-vis relative to each other and a first capacitor electrode, one of the oscillating electrodes being electrically connected to the first capacitor electrode, and the other oscillating electrode being electrically connected to an output connection terminal which is arranged on a lateral edge portion of the first piezoelectric substrate to form a first electrode pattern on the first surface, the second main surface including a common electrode arranged oppositely relative to the first pair of oscillating electrodes and a second capacitor electrode arranged opposite to the first capacitor electrode, the second capacitor electrode and the common electrode being electrically connected to each other to form a second electrode pattern on the second surface, the pair of oscillating electrodes and the common electrode defining a first oscillating section, and the first and second capacitor electrodes defining a first coupling capacitor;

a second piezoelectric substrate having a first main surface and a second main surface opposite to the first main surface, the first main surface including a second pair of oscillating electrodes arranged vis-a-vis relative to each other and a third capacitor electrode, one of the oscillating electrodes being electrically connected to the third capacitor electrode, and the other oscillating electrode being electrically connected to an input connection terminal which is arranged on a lateral edge portion of the second piezoelectric substrate to form a third electrode pattern on the first surface, the second main surface including a common electrode arranged oppositely relative to the second pair of oscillating electrodes and a fourth capacitor electrode arranged opposite to the third capacitor electrode, the fourth capacitor electrode and the common electrode being electrically connected to each other to form a fourth electrode pattern on the second surface, the pair of oscillating electrodes and the common electrode defining a second oscillating section, and the third and fourth capacitor electrodes defining a second coupling capacitor;

the first and second piezoelectric substrates being laid one on the other to form a multilayer structure without obstructing the oscillation of the oscillating sections and making the output connecting terminal on the first piezoelectric substrate and the input connecting terminal on the second piezoelectric substrate vertically aligned relative to each other, the first capacitor electrode on the first piezoelectric substrate being connected to the third capacitor electrode on the second piezoelectric substrate, and the second capacitor electrode on the first piezoelectric substrate being connected to the fourth capacitor electrode on the second piezoelectric substrate;

an insulating base plate having a bottom surface provided with an output electrode which is vertically aligned with and connected to the output connecting terminal, an input electrode which is vertically aligned with and connected to the input connecting terminal, and grounding electrodes which are connected to each of the second and fourth electrode patterns, the insulating base plate being arranged as a most bottom layer; and a shielding conductive member provided on an upper surface of the insulating base plate for preventing an electromagnetic coupling between the input electrode and the output electrodes, the shielding conductive member being connected to the grounding electrodes.

17. An energy trapping type piezoelectric filter as claimed in claim 16, wherein said shielding conductive member is arranged to surround an input connector terminal provided on the upper surface of said insulating base plate and connected to said input electrode.

18. An energy trapping type piezoelectric filter as claimed in claim 17, wherein said input electrode and said two output electrodes are arranged at corners of said insulating base plate, and said ground electrodes are arranged at middle of opposite lateral edges of said insulating base plate.

19. An energy trapping type piezoelectric filter as claimed in claim 17, wherein said shielding conductive member has one end connected via a grounding connector terminal to one of said ground electrodes and the other end connected via another grounding connector terminal to one end of a shielding electrode which is provided on bottom surface of said insulating base plate.

20. An energy trapping type piezoelectric filter as claimed in claim 17, wherein said insulating base plate includes a conductive connector member provided on the upper surface thereof for connecting said two output electrodes.

21. An energy trapping type piezoelectric filter as claimed in claim 20, wherein said input electrode and one of said two output electrodes which is connected to an external output circuit are arranged at both ends of one lateral edge of said insulating base plate.

22. An energy trapping type piezoelectric filter as claimed in claim 16, wherein said input electrode and said two output electrodes are arranged at corners of said insulating base plate, and said ground electrodes are arranged at middle of opposite lateral edges of said insulating base plate.

23. An energy trapping type piezoelectric filter as claimed in claim 22, wherein said shielding conductive member has one end connected via a grounding connector terminal to one of said ground electrodes and the other end connected via another grounding connector terminal to one end of a shielding electrode which is provided on bottom surface of said insulating base plate.

24. An energy trapping type piezoelectric filter as claimed in claim 22, wherein said insulating base plate includes a conductive connector member provided on the upper surface thereof for connecting said two output electrodes.

25. An energy trapping type piezoelectric filter as claimed in claim 24, wherein said input electrode and one of said two output electrodes which is connected to an external output circuit are arranged at both ends of one lateral edge of said insulating base plate.

26. An energy trapping type piezoelectric filter as claimed in claim 16, wherein said shielding conductive member has one end connected via a grounding connector terminal to one of said ground electrodes and the other end connected via another grounding connector terminal to one end of a shielding electrode which is provided on bottom surface of said insulating base plate.

27. An energy trapping type piezoelectric filter as claimed in claim 26, wherein said insulating base plate includes a conductive connector member provided on the upper surface thereof for connecting said two output electrodes.

28. An energy trapping type piezoelectric filter as claimed in claim 27, wherein said input electrode and one of said two output electrodes which is connected to an external output circuit are arranged at both ends of one lateral edge of said insulating base plate.

29. An energy trapping type piezoelectric filter as claimed in claim 16, wherein said insulating base plate includes a conductive connector member provided on the upper surface thereof for connecting said two output electrodes.

30. An energy trapping type piezoelectric filter as claimed in claim 29, wherein said input electrode and one of said two output electrodes which is connected to an external output circuit are arranged at both ends of one lateral edge of said insulating base plate.

* * * * *